AGC VOLTAGE CONTROLLED THIN-FILM RF ATTENUATOR

Filed April 19, 1963 3 Sheets-Sheet 1

INVENTORS
WILLIAM S. ELLIOTT
HARLAN G. MICHAEL
BY
Moody and Kintzinger
ATTORNEYS

AGC VOLTAGE CONTROLLED THIN-FILM RF ATTENUATOR

Filed April 19, 1963 3 Sheets-Sheet 2

INVENTORS
WILLIAM S. ELLIOTT
HARLAN G. MICHAEL
BY
Moody and Kintzinger
ATTORNEYS

AGC VOLTAGE CONTROLLED THIN-FILM RF ATTENUATOR

Filed April 19, 1963 3 Sheets-Sheet 3

INVENTORS
WILLIAM S. ELLIOTT
HARLAN G. MICHAEL
BY
Moody and Kintzinger
ATTORNEYS United States Patent Office 3,259,846

Patented July 5, 1966

3,259,846
AGC VOLTAGE CONTROLLED THIN-FILM RF ATTENUATOR

William S. Elliott, Cedar Rapids, Iowa, and Harlan G. Michael, Huntsville, Ala., assignors to Collins Radio Company, Cedar Rapids, Iowa, a corporation of Iowa Filed Apr. 19, 1963, Ser. No. 274,190
17 Claims. (Cl. 325—415)

Figure 1:
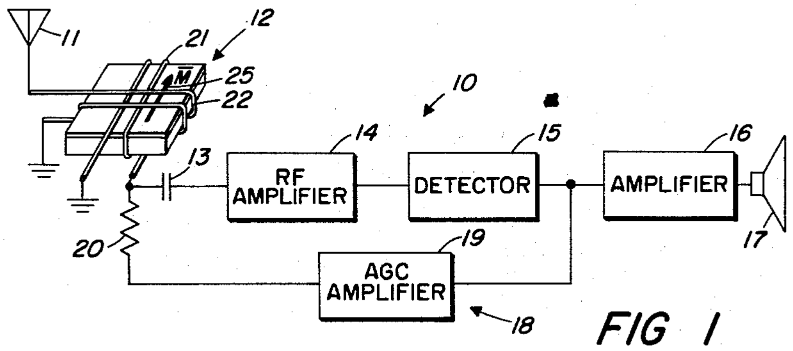

This invention relates in general to amplifier gain control, and in particular to an automatic gain control system with variation in AGC voltage applied to a thin-film device for controlling the degree of attenuation of signals imparted to and passed through the device.

Whenever it becomes necessary to construct an amplifier with triode tubes or transistors having sharp-cutoff characteristics, problems of excessive distortion and cross modulation are likely to arise, and particularly so if an effort is made to obtain a wide dynamic range of input signal levels with many existing AGC control systems. Many of these AGC systems supply variable voltage to some element of an amplifying device in order to alter the forward signal transfer characteristics of the device. The variable voltage is usually taken from the output of the amplifier so that its magnitude is some measure of the input signal level. However, application of such control voltage to a sharp-cutoff device causes non-linear operation and severely limits the magnitude of input signals that may be handled without excessive distortion.

Considerable effort has gone into devising wide dynamic range amplifying systems. For example, great effort has been expended in the area of making an amplifying device having linear characteristics for the input signal and having slowly varying gain characteristics as control voltage (or current) varies. This approach is used by such system solutions as those using the remote cutoff tube and/or the tetrode transistor. However, for low noise UHF amplifier use, or low noise transistor IF amplifier applications, and various other applications, it is not possible to obtain remote cutoff tubes or tetrode transistors having the desired low noise characteristics. An alternate solution is to operate sharp-cutoff devices in a linear manner and to obtain the variable signal transfer characteristics through some other device having linear characteristics for linear operations through all signal levels and at all levels of forward signal transfer.

It is, therefore, a principal object of this invention to provide automatic gain control for an amplifier with an attenuator for linear operation over a wide dynamic range and with distortion products normally present with many control methods substantially eliminated even though low noise transistors or tubes are advantageously used in the AGC controlled amplifier.

Another object is to provide an AGC circuit for a signal amplifying system that allows amplifying devices (such as transistors) to be operated in a circuit designed for optimum linearity and stability. This would make possible an IF amplifier in which center frequencies, band width, and gain are not affected by expected changes in operating parameters, such as temperature variation and supply voltage change, and with these characteristics substantially unaffected by application of different AGC voltages with variation in input signal levels.

A further object is to provide such AGC amplifier systems readily applicable for use in various HF, VHF and UHF communication and radio navigation equipments.

A feature of this invention, useful in accomplishing the avove objects, is the use of an RF attenuator utilizing the single-domain behavior of very thin ferromagnetic films for producing a variable attenuation in accordance with the magnitude of a variable control voltage or current.

One method for producing such ferromagnetic films, with the desired single-domain behavior characteristics, is by vacuum depositing the thin magnetic film on a glass substrate in the presence of an external magnetic field. The film acts like a single domain with a rest direction of the magnetic vector $\overline{M}$ in the direction of the external magnetic field which was used during the vacuum deposition of the film. With some embodiments of this invention, two windings are placed at right angles around the film and its supporting glass substrate so that the axis of one winding is parallel to the rest direction of the magnetic vector $\overline{M}$. These two windings are, in effect, an RF voltage signal input winding and a secondary winding and, as along as no D.C. voltage is applied to the secondary, no RF voltage will be coupled from the RF input winding to the secondary winding through the magnetic field since the RF in the input winding produces a magnetic field which is parallel to the rest direction of the magnetic vector $\overline{M}$. The vector $\overline{M}$ is therefore not moved from its rest direction and thus no changing flux linkages are produced to induce a voltage in the secondary winding.

However, when D.C. voltage is applied to the secondary, the resulting current through this secondary winding rotates the magnetic vector $\overline{M}$ away from its rest direction by an amount proportional to the magnitude of the D.C. control voltage applied. Then, when RF signals are applied to the input winding, the magnetic vector $\overline{M}$ is caused to rotate about its new direction to thereby induce a corresponding output voltage in the output winding which is substantially an undistorted image of the RF signal input. Further, the magnitude of the induced voltage in the output winding depends upon the position of the magnetic vector $\overline{M}$ and, in turn, upon the D.C. control voltage applied to the output winding. Thus, use of one or more of these variable RF attenuators between various stages of RF or IF amplifier stages, as part of an AGC circuit, will aid in providing wide dynamic range in amplification. With this system, the AGC amplifier must supply maximum current to the thin-film attenuator at minimum RF signal input, and minimum current at maximum signal input.

It should be noted that there are other various embodiments. For example, in a system where the thin-film attenuator has a magnetic vector $\overline{M}$ initially not parallel with the axis of the output winding, somewhere 5 to 10 degrees off the axis, application of the RF signal to the input causes an increase in the current supplied from the AGC amplifier to rotate the vector $\overline{M}$ in the direction which causes an increase in attenuation. Other embodiments have various orientations of the magnetic vector $\overline{M}$, and application of the AGC controlling voltage to either the RF input winding or the secondary output winding, as appropriate for the particular embodiments involved, and operate with either a controlling D.C. voltage increase or decrease, as appropriate, with an increasing RF input signal.

Specific embodiments representing what are presently regarded as the best modes for carrying out the invention are illustrated in the accompanying drawings.

Figure 2:
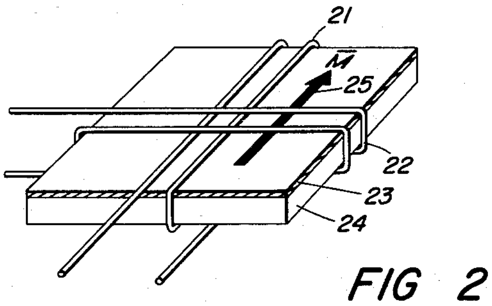
Figure 3:
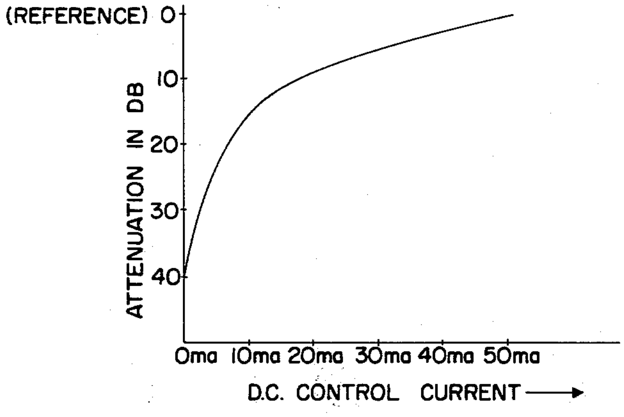
Figure 4:
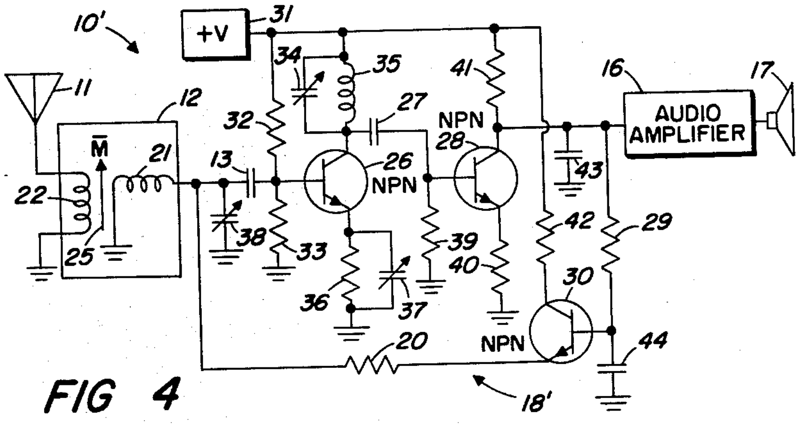
Figure 5:
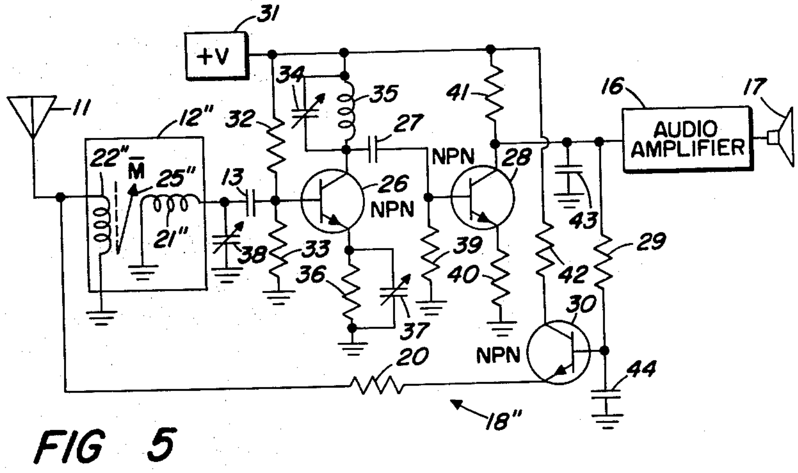
Figure 6:
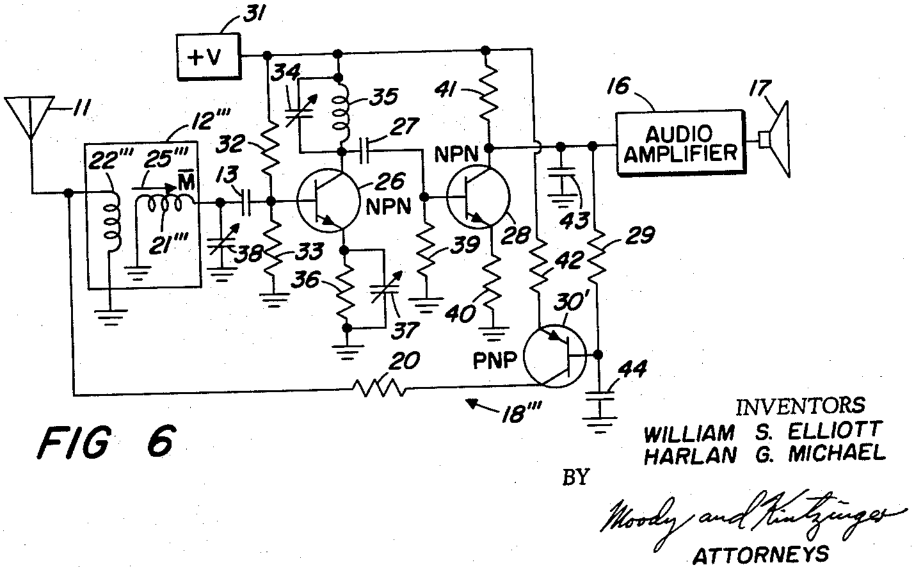
Figure 7:
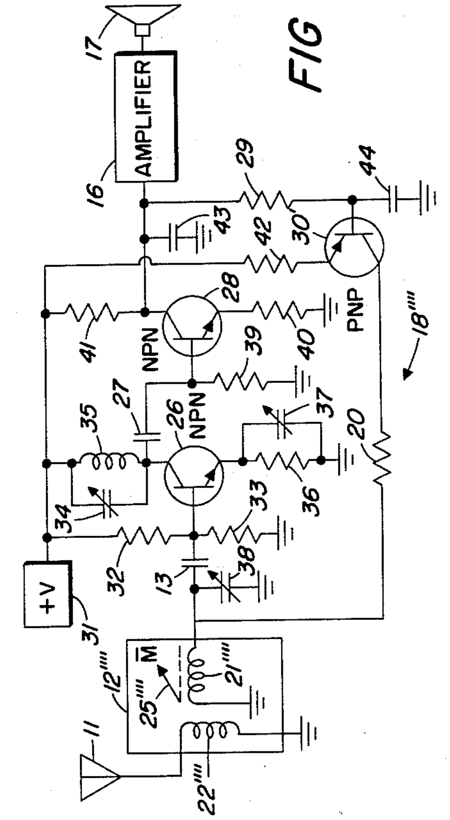
Figure 8:
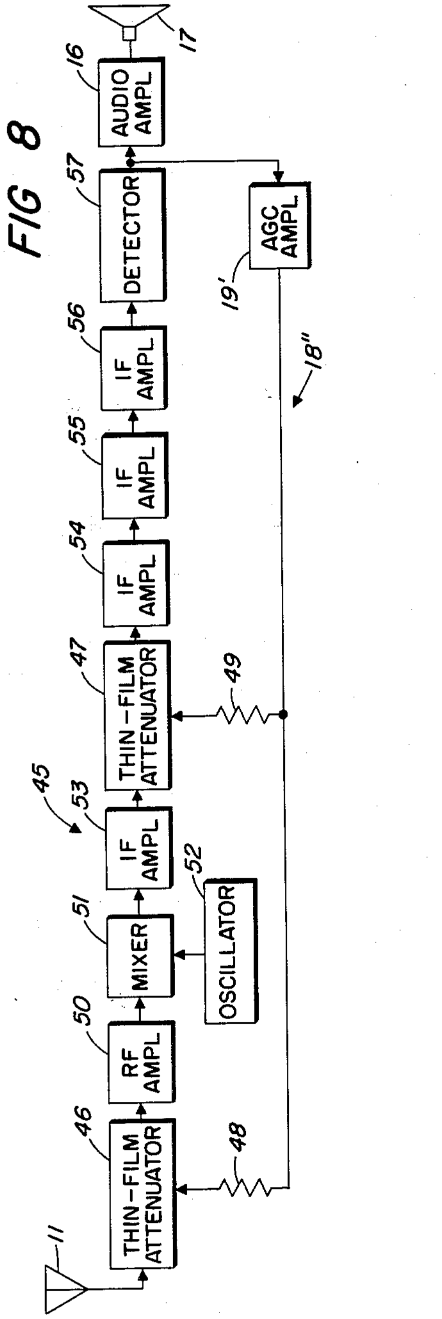

In the drawings:

FIGURE 1 represents a radio receiver equipped with an AGC voltage controlled thin-film RF attenuator;

FIGURE 2, a perspective view of the thin-film RF attenuator used in the radio receiver of FIGURE 1;

FIGURE 3, a graph of Attenuation in db-to-D.C. Control Current illustrating control characteristics of a thin-film attenuator such as shown in FIGURE 2 and used in the FIGURE 1 embodiment;

FIGURE 4, a schematic of a radio receiver illustrating a circuit for obtaining decreasing control current in an AGC amplifier with an increasing RF signal input in another thin-film attenuator embodiment;

FIGURE 5, a schematic of another radio receiver, AGC system and thin-film attenuator embodiment with the thin-film magnetic vector $\overline{M}$ at a small angle from the axis of the RF signal input winding, and with the AGC control voltage applied to the input winding;

FIGURE 6, another embodiment with the magnetic vector $\overline{M}$ parallel to the secondary winding and with the AGC control voltage applied to the primary winding of the thin-film attenuator;

FIGURE 7, another radio receiver with the magnetic vector $\overline{M}$ at a small angle from the axis of the output winding and with the AGC control voltage applied to the output winding; and FIGURE 8, a block diagram of a superheterodyne receiver utilizing two thin-film attenuators in an AGC system having one thin-film device at the RF input and the other thin-film device located in the IF portion of the receiver.

Referring to the drawings:

The RF receiver 10 of FIGURE 1 receives an RF signal from antenna 11. The RF signal is fed through thin-film attenuator 12 and capacitor 13 to RF amplifier 14. The output of RF amplifier 14 is passed to and through an audio detector 15 and on through an audio amplifier 16 to speaker 17. An AGC loop 18 is connected to the output of detector 15, has an AGC voltage signal amplifier 19, and resistor 20, and is connected to the secondary winding 21 of thin-film attenuator 12 and through the secondary winding to a voltage potential reference, shown in FIGURE 1 to be ground. The primary winding 22 of the thin-film attenuator 12 is connected to receive the RF input from antenna 11 and is connected at the other end to ground. Referring also to FIGURE 2, the thin magnetic film 23 is vacuum deposited on a glass substrate 24 (or other suitable supporting material) in the presence of an external magnetic field so the film will act like a single domain with a rest direction parallel to the arrow 25 indicating the direction of the magnetic vector $\overline{M}$ which, in this instance, is perpendicular to the secondary winding 21. It is to be noted that the thin-film attenuator 12 is so constructed that the windings 21 and 22 are substantially mutually perpendicular, and the windings are wound about the thin film 23 and its glass substrate 24 to desired orientation with relation to the magnetic vector $\overline{M}$.

During operation, as long as no D.C. voltage is applied to the secondary winding 21, RF signal input voltages are not coupled from RF input winding 22 through the thin magnetic film, since the magnetic field produced by RF signal voltages in the input winding 22 produce a magnetic field substantially parallel to the rest direction of the magnetic vector $\overline{M}$. Since no AGC control voltage is applied to the secondary winding 21, the magnetic vector $\overline{M}$ is not displaced from its rest direction and no changing flux linkages are produced which would induce a voltage in the secondary winding. However, the AGC loop 18 is arranged to provide a maximum D.C. control current at minimum RF signal input voltage, and minimum current at maximum RF input. Thus, the relatively maximum D.C. control current, applied to the secondary winding when there is no RF signal input, rotates the magnetic vector $\overline{M}$ away from its rest direction by an amount proportional to the magnitude of the D.C. control voltage applied. Then, when RF signals are applied to the input winding 22, the magnetic vector $\overline{M}$ is caused to rotate about its new direction, thereby inducing a corresponding output voltage in the output winding 21 with the output voltage substantially an undistorted image of the RF signal input. Further, the magnitude of the induced voltage in the output winding 21 depends upon the degree of position displacement of the magnetic vector $\overline{M}$ and, in turn, upon the AGC derived control D.C. voltage applied to the output winding 21.

An AGC amplifying system where the AGC loop must also supply maximum control current to the winding of the thin-film attenuator at minimum RF input, and minimum control current at maximum RF output, such as used in the embodiment of FIGURE 1, is shown in detail in the embodiment of FIGURE 4, to be described later.

Reference to FIGURE 3, a graph of Attenuation In db-to-D.C. Control Current, illustrates the attenuation characteristics of a thin-film attenuator 12, such as employed in the embodiment of FIGURE 1.

In the embodiment of FIGURE 4, components duplicating those in the embodiment of FIGURE 1 are, for the sake of convenience, numbered the same. RF receiver 10' of FIGURE 4 receives an RF signal from antenna 11. The RF signal is fed from antenna 11 through thin-film attenuator 12, similar to the thin-film attenuator 12 of FIGURE 1, with the arrow 25, representing the magnetic vector $\overline{M}$ at rest, parallel to the axis of input winding 22.

The output of the thin-film attenuator 12 is passed through capacitor 13 to the base of RF amplifier NPN transistor 26. The output collector of RF amplifier transistor 26 is passed through capacitor 27 and, as an input, to the base of detector NPN transistor 28. The output collector of the detector transistor 28 is passed through audio amplifier 16 to speaker 17. The audio output collector of transistor 28 is also connected through resistor 29 to the base of AGC amplifier NPN transistor 30 of the AGC loop 18'. The output emitter of the AGC amplifier transistor 30 is connected through resistor 20 to the secondary winding 21 of thin-film attenuator 12 and through the secondary winding to ground.

A positive voltage supply 31, for example 15 volts D.C., is connected serially through resistors 32 and 33 to ground and at the junction of the resistors 32 and 33 to the base of transistor 26. This voltage supply 31 is also connected to the output collector of transistor 26 through a parallel capacitor 34 and coil 35 resonant subcircuit, and the emitter of the transistor 26 is connected through resistor 36 and capacitor 37 in parallel to ground. The junction of secondary winding 21 and capacitor 13, in addition to its connection with the AGC loop 18', is connected to ground through adjustable capacitor 38. The detector transistor 28 is suitably biased for detection of audio from a modulated RF input signal by its connections of the base through resistor 39 to ground, the emitter through resistor 40 to ground, and the positive D.C. voltage supply 31 through resistor 41 to the output collector. The positive voltage supply is also connected through resistor 42 to the collector of AGC amplifier 30.

Capacitor 43 is connected between the output collector of transistor 28 and ground to filter out RF, and the capacitor 44 connected between the base of AGC amplifier transistor 30 and ground, cooperating with resistor 29, filters audio from the AGC loop to insure that only the D.C. voltage component of detected output is fed back to the attenuator 12. In this embodiment, D.C. voltage applied by the AGC loop 18' to the secondary winding 21 of the thin-film attenuator 12 is at a maximum when there is minimum RF, or no RF, input to the primary winding 22, and this voltage decreases with increasing RF input to the primary winding 22 and with the corresponding increase in detected audio output. Thus, with the decrease in AGC voltage applied consistent with increasing RF signal voltage input, attenuation increases through the thin-film attenuator 12.

Referring now to the embodiment of FIGURE 5, components duplicating those in the embodiment of FIGURE 4 are, for the sake of convenience, numbered the same, and reference is made to the description of the embodiment of FIGURE 4, for portions not repeated here. In this embodiment the radio receiver is the same after the thin-film attenuator 12'' as with the radio receiver 10', except that the AGC loop is connected through the input primary winding 22″ to ground instead of to the secondary winding 21″. The thin-film attenuator 12″ of this embodiment is provided with a magnetic vector $\overline{M}$ indicated to be in the rest position, with no RF input and no D.C. control voltage applied to input winding 22″, by the arrow 25″. With this embodiment, D.C. voltage applied by the AGC loop 18′ to the primary input winding 22″ is at a maximum when there is minimum RF, or no RF, input to the primary winding 22″, and this voltage decreases with increasing RF input to the primary winding 22″ and with the corresponding increase in detector audio output. Thus, the end result with this embodiment is similar to that with the embodiment of FIGURE 4 in that, with a decrease in AGC voltage applied, consistent with an increasing RF signal voltage input, attenuation is increased through thin-film attenuator 12″.

With the embodiment of FIGURE 6, components duplicating those in the embodiment of FIGURE 4 are, for the sake of convenience, numbered the same, and reference is made to the description of the embodiment of FIGURE 4 for portions not repeated here. In this embodiment, following the thin-film attenuator 12‴, the radio receiver is the same as the radio receiver 10′ of FIGURE 4 except that the positive voltage supply 31 is connected through resistor 42 to the emitter of PNP transistor 30′, the collector of which is connected through the resistor 20, of AGC loop 18‴, to the input winding 22‴ instead of to the secondary winding 21‴. Further, the AGC loop is arranged to apply minimum AGC control voltage when there is minimum, or no, RF input to the primary winding 22‴. This AGC control D.C. voltage applied to winding 22‴ increases with increasing RF input signal voltages and with the corresponding increase in detector audio output. Since the rest position of the magnetic vector $\overline{M}$, as indicated by arrow 25‴, is parallel to the axis of the secondary winding 21‴ the vector $\overline{M}$ is in position, without deflection, for minimum attenuation through the thin-film attenuator when RF signal voltages are at a minimum.

Referring also to the embodiment of FIGURE 7, components duplicating those in the embodiment of FIGURE 6 and FIGURE 4 are, for the sake of convenience, numbered the same and reference is made to foregoing description, particularly for the embodiment of FIGURE 4 with some addition in the embodiment of FIGURE 6, for portions not repeated here. The rest position of the magnetic vector $\overline{M}$, as indicated by arrow 25⁗, is displaced at a small angle, approximately 5 to 10 degrees, from being parallel to the axis of output winding 21⁗. This particular embodiment, in order to provide minimum attenuation when no RF signal voltages are applied to the input winding 22⁗, requires minimum application of control current to the output winding 21⁗ from AGC loop 18′ which, in this instance, just as with the FIGURE 4 embodiment, is connected through the output winding 21⁗ to ground. The AGC amplifier is a PNP transistor 30′ which increases its current output through the AGC loop 18′ when the voltage at the collector of the detector transistor 28 decreases with application of increasing RF signal voltage to input winding 22⁗.

Referring now to FIGURE 8, a superheterodyne receiver 45 is shown to be equipped with two thin-film attenuators 46 and 47, subject to control by the AGC voltages developed through AGC amplifier 19′ and applied through AGC loop 18″, including the resistors 48 and 49, respectively. In this superheterodyne receiver, RF signal input voltages are applied from antenna 11 to and through, successively, thin-film attenuator 46, RF amplifier 50, mixer 51 which receives a frequency signal from injection oscillator 52, IF amplifier 53, thin-film attenuator 47, IF amplifiers 54, 55 and 56, detector 57, and audio amplifier 16, to speaker 17. Obviously, any of the various thin-film attenuation embodiments may be employed for attenuators 46 and 47 with the only limitation being that their mode of operation, with respect to AGC voltages applied, be consistent. In other words, both the thin-film attenuators 46 and 47 must have increasing attenuation with increasing RF input voltages from antenna 11 controlled by increasing AGC voltage levels, or both must develop increasing attenuation with increasing RF input voltage levels along with corresponding decreasing AGC voltages from a maximum at no RF signal input voltage.

Thus, there are hereinabove provided various thin-film attenuator embodiments for use with amplifier AGC loops wherein application of increasing RF signal input voltages to the amplifier causes such a change in control voltage or current developed from an AGC loop amplifier that the magnetic vector $\overline{M}$ of a thin-film attenuator is progressively rotated to positions giving more RF signal attenuation.

Whereas this invention is here illustrated and described with respect to several embodiments thereof, it should be realized that various changes may be made without departing from the essential contributions to the art made by the teachings hereof.

We claim:

1. An RF amplifier automatic gain control (AGC) system using a thin-film ferromagnetic attenuator for attenuation of RF input signals to the amplifier, for operation over a wide dynamic range, including: said thin-film ferromagnetic attenuator with a ferromagnetic substantially single domain thin-film desposited on a mounting substrate in the presence of an external magnetic field for obtaining a maznetization vector having a predetermined rest direction, and having two coil windings about the thin-film with the windings substantially mutually perpendicular and with the rest direction of the single domain magnetic vector being within a relatively small angle from being parallel to the axis of one of said coil windings; RF signal input means connected to one of said coil windings with the coil a signal input primary winding; means coupling the other coil winding, as a signal output secondary winding, to an RF amplifier; a detector connected for receiving the output of said RF amplifier and having output means; and an AGC loop connected to said output means for developing AGC direct current control voltage and applying the control voltage to one of the coil windings of said thin-film attenuator.

2. The automatic gain control system of claim 1, wherein said AGC loop has AGC amplifying means.

3. The AGC system of claim 1, wherein amplification and signal developing means is provided in said AGC loop for developing maximum AGC direct current control voltage with a minimum RF signal input signal level to the primary coil winding of the attenuator, and a direct current control voltage decrease with increasing RF signal input.

4. The AGC system of claim 3, wherein said AGC loop is connected for applying AGC direct current through the secondary coil winding of said thin-film attenuator.

5. The AGC system of claim 3, wherein said AGC loop is connected for applying AGC direct current through the primary coil winding of said thin-film attenuator.

6. The AGC system of claim 3, wherein the amplification and signal devlopment means includes a NPN transistor with its base connected to the audio output means of said detector, a collector connected to a positive voltage supply, and an emitter connected to one of the coil windings of the thin-film attenuator.

7. The AGC system of claim 1, wherein said RF amplifier includes a transistor; and said detector includes a transistor.

8. The AGC system of claim 1, wherein the single domain magnetic vector is substantially parallel to the axis of one of said coil windings.

9. The AGC system of claim 1, wherein the single domain magnetic vector is displaced from being parallel to the axis of one of said coil windings by a small angle in the range of approximately 5 to 10 degrees.

10. The AGC system of claim 1, wherein amplification and signal developing means is provided in said AGC loop for developing minimum AGC direct current control voltage with minimum RF signal input signal levels to the primary coil winding of the attenuator, and with direct current control voltage increasing with increasing RF signal input.

11. The AGC system of claim 10, wherein said AGC loop is connected for applying AGC direct current through the secondary coil winding of said thin-film attenuator.

12. The AGC system of claim 10, wherein said AGC loop is connected for applying AGC direct current through the primary coil winding of said thin-film attenuator.

13. The AGC system of claim 10, wherein the amplification and signal development means includes a PNP transistor with its base connected to the audio output means of said detector, emitter connected to a positive voltage supply, and its collector connected to one of the coil windings of the thin-film attenuator.

14. In a radio frequency receiving system having an RF amplifier and a detector; an automatic gain control (AGC) system using a thin-film attenuator for attenuation of RF input signals to the amplifier, and with said thin-film attenuator having a ferromagnetic substantially single domain thin-film deposited on a mounting substrate in the presence of an external magnetic field for obtaining a magnetization vector having a pre-established rest direction, and having two coil windings about the thin-film with the windings substantially mutually perpendicular and with the rest direction of the single domain magnetic vector being within a relatively small angle from being parallel to the axis of one of said coil windings; RF signal input means connected to one of said coil windings with a coil a signal input primary winding; means coupling the other coil winding, as a signal output secondary winding, to an RF amplifier; a detector connected for receiving the output of said RF amplifier and having audio output means; audio amplifying means connected for receiving the audio output of said detector and connected to a speaker; and an AGC loop connected to said audio output means for developing AGC direct current control voltage and applying the control voltage to one of the coil windings of said thin-film attenuator.

15. In a radio frequency receiving system having an antenna, RF amplifier means, frequency generating means, frequency signal mixing means, and IF amplifying means; an AGC system including multiple thin-film attenuators with each of said thin-film attenuators having a ferromagnetic substantially single domain thin film deposited on a mounting substrate and having a magnetization vector with a pre-established rest direction, and with each thin-film attenuator having two coil windings about the thin film with the windings substantially mutually perpendicular and with the rest direction of the single domain magnetic vector being within a relatively small angle from being parallel to the axis of one of said coil windings; one of the coil windings of each thin-film attenuator being connected as a signal input primary winding, and the other connected as a signal output secondary winding; a detector in said radio frequency system connected for receiving an output from said IF amplifying means and having audio output means connected through an audio amplifier to a speaker; and an AGC loop having means for developing AGC direct current control voltage and applying this voltage simultaneously to a coil winding of each of said multiple thin-film attenuators.

16. The AGC system of claim 15, wherein the AGC direct current control voltage means develops maximum AGC direct current control voltage with a minimum RF input signal level from the antenna, and a direct current control voltage decrease with an increasing RF signal input for increasing signal attenuation through the multiple thin-film attenuators.

17. The AGC system of claim 15, wherein the AGC direct current control voltage means develops minimum AGC direct current control with minimum RF input signal levels from the antenna, and direct current control voltage increase with an increasing RF signal input for increasing signal attenuation through the multiple thin-film attenuators.

No references cited.

KATHLEEN H. CLAFFY, *Primary Examiner*.

R. LINN, *Assistant Examiner*.